United States Patent

Saenger et al.

[11] Patent Number: 6,027,966
[45] Date of Patent: *Feb. 22, 2000

[54] ISOLATED SIDEWALL CAPACITOR

[75] Inventors: Katherine Lynn Saenger, Ossining; James H. Comfort, New City; Alfred Grill, White Plains; David Edward Kotecki, Hopewell Junction, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/910,179

[22] Filed: Aug. 13, 1997

Related U.S. Application Data

[62] Division of application No. 08/577,178, Dec. 22, 1995, Pat. No. 5,914,851.

[51] Int. Cl.[7] .................................................. H01L 21/70
[52] U.S. Cl. ........................ 438/239; 438/396; 438/639
[58] Field of Search .................................. 438/396, 397, 438/3, 629, 639, 243, 239, 240, 250, 253, 666, 668, 672, 675; 361/311; 257/295

[56] References Cited

U.S. PATENT DOCUMENTS

| | | | |
|---|---|---|---|
| 4,591,738 | 5/1986 | Bialas, Jr. et al. | 307/296 R |
| 4,954,927 | 9/1990 | Park | 361/328 |
| 5,081,559 | 1/1992 | Fazan et al. | 361/313 |
| 5,189,503 | 2/1993 | Suguro et al. | 257/310 |
| 5,192,704 | 3/1993 | McDavid et al. | 437/52 |
| 5,196,909 | 3/1993 | Chan et al. | 257/296 |
| 5,208,725 | 5/1993 | Akcasu | 361/313 |
| 5,313,089 | 5/1994 | Jones, Jr. | 257/295 |
| 5,330,931 | 7/1994 | Emesh et al. | 438/3 |
| 5,335,138 | 8/1994 | Sandhu et al. | 361/303 |
| 5,365,096 | 11/1994 | Taniguchi | 257/296 |
| 5,366,920 | 11/1994 | Yamamichi et al. | 437/52 |
| 5,371,700 | 12/1994 | Hamada | 365/149 |
| 5,382,817 | 1/1995 | Kashihara et al. | 257/295 |
| 5,383,088 | 1/1995 | Chapple-Sokol et al. | 361/305 |
| 5,384,729 | 1/1995 | Sameshima | 365/145 |
| 5,389,566 | 2/1995 | Lage | 438/3 |
| 5,392,189 | 2/1995 | Fazan et al. | 361/305 |
| 5,397,748 | 3/1995 | Watanabe et al. | 437/239 |
| 5,401,680 | 3/1995 | Abt et al. | 438/3 |

(List continued on next page.)

FOREIGN PATENT DOCUMENTS

| | | | |
|---|---|---|---|
| 3-011761 | 1/1991 | Japan | H01L 27/04 |
| 5-343615 | 12/1993 | Japan | H01L 27/04 |
| 70-94599 | 4/1995 | Japan | H01L 21/8242 |
| 62-190869 | 8/1997 | Japan | H01L 27/10 |

OTHER PUBLICATIONS

D. E. Kotecki and K. L. Saenger, "Fabrication Process for Container and Crown Electrodes in Memory Devices", IBM Technical Disclosure Bulletin, vol. 38, No. 11, Nov. 1995, pp. 197–199.

P. Fazan et al., Patent Application filed Sep. 21, 1995 (Micron Semiconductor), Micron Docket No. 94–0355, "A Scalable Barrierless High Epsilon Capacitor Structure with Sub–Lithography Capacitor Spacing".

B. Gnade et al., Patent Application S/N 08/283,881 filed Aug. 1, 1994 (Texas Instruments & Advanced Technology Materials), "Improved MIM High Permittivity Capacitor Structure, and Process to Form Such a Structure".

*Primary Examiner*—Carl Whitehead, Jr.
*Assistant Examiner*—Maria Guerrero
*Attorney, Agent, or Firm*—Alison D. Mortinger; Anne V. Dougherty

[57] ABSTRACT

A capacitor structure is provided, with a first conductor on top of a substrate, a first non-conductor on top of and substantially in register with the first conductor, the first conductor and first non-conductor having a first opening formed therein, a non-conductive sidewall spacer formed in the first opening, the non-conductive sidewall spacer having a second opening formed therein, and a second conductor formed in the second opening.

8 Claims, 6 Drawing Sheets

U.S. PATENT DOCUMENTS

| | | | |
|---|---|---|---|
| 5,405,796 | 4/1995 | Jones, Jr. | 437/47 |
| 5,416,042 | 5/1995 | Beach et al. | 437/60 |
| 5,436,477 | 7/1995 | Hashizume et al. | 257/310 |
| 5,438,011 | 8/1995 | Blalock et al. | 437/52 |
| 5,438,012 | 8/1995 | Kamiyama | 437/60 |
| 5,442,213 | 8/1995 | Okudaira et al. | 257/310 |
| 5,498,889 | 3/1996 | Hayden | 353/737 |
| 5,527,723 | 6/1996 | Witek et al. | 438/212 |
| 5,573,979 | 11/1996 | Tsu et al. | 438/396 |
| 5,583,360 | 12/1996 | Roth et al. | 257/316 |
| 5,585,998 | 12/1996 | Kotecki et al. | 361/321.4 |
| 5,631,185 | 5/1997 | Kim et al. | 438/397 |
| 5,701,647 | 12/1997 | Saenger et al. | 29/25.42 |

ISOLATED SIDEWALL CAPACITOR

This application is a divisional application based on Ser. No. 08/577,178, filed Dec. 22, 1995 now U.S. Pat. No. 5,914,851.

RELATED APPLICATIONS

This invention is related to the following copending U.S. Patent applications:

1) Ser. No. 08/577,168, filed Dec. 22, 1995, now U.S. Pat. No. 5,633,781 and Attorney Docket YO9-95-141B, Ser. No. 08/787,072 filed Jan. 22, 1997, still pending, Attorney Docket YO9-95-141, entitled "Isolated Sidewall Capacitor Having a Compound Plate Electrode";
2) Ser. No. 08/577,166, filed Dec. 22, 1995, now U.S. Pat. No. 5,585,998, Attorney Docket FI9-95-150, entitled "Isolated Sidewall Capacitor with Dual Dielectric";
3) Ser. No. 08/577,165, filed Dec. 22, 1995, now allowed and Attorney Docket FI9-95-163B filed on Aug. 7, 1997 and still pending, Attorney Docket FI9-95-163, entitled "Isolated Sidewall Capacitor with L-Shaped Dielectric";

all filed on the same day, assigned to the present assignee, and incorporated by reference in their entireties.

FIELD OF THE INVENTION

This invention is directed to capacitors and the manufacture of the same, and more particularly to a capacitor employing a structure which is suitable for use with high dielectric constant materials.

BACKGROUND OF THE INVENTION

In the manufacture of ultra large scale integration (ULSI) circuit devices, DRAM (dynamic random access memory) and FRAM (ferroelectric random access memory) chips have become increasingly dense. As density increases, feature size shrinks, and so too does memory cell size. The capacitors that are an integral part of memory cells must therefore take up a minimum of space (i.e. have a small "footprint") and still be capable of storing large amounts of electrical charge (i.e. a capacitance on the order of 30 Ff).

Capacitance is a function of dielectric area and the dielectric constant of the dielectric material, and is inversely proportional to the thickness of the dielectric. Thus one method of achieving increased capacitance in a smaller area is to use materials with higher dielectric constants as dielectrics. However, the use of high dielectric constant materials presents a problem when using traditional materials like silicon as an electrode. The silicon can react with the high dielectric constant material or oxidize during deposition of the high dielectric constant material and form an interface layer of silicon dioxide, which reduces the effective dielectric constant of the dielectric material.

Deposition temperature and leakage are other problems involved in high dielectric constant materials. Because they must be deposited at relatively high temperatures, the first-deposited electrode is formed from a high melting point conductive material which does not oxidize or react with the dielectric. In addition, the electrode material should have a large work function to increase the height of the Schottky barrier. Platinum (Pt) and other similar materials are suitable for use as electrodes in this situation. However, these electrode materials are typically difficult to pattern using conventional processes. For example, using reactive ion etching (RIE) to pattern Pt results in sloped sidewalls which, given a thick layer, can result in a significant reduction of available surface area on which to form the capacitor. Additionally, while high dielectric constant materials must be isolated from silicon, a good connection must be formed between the capacitor and the semiconductor circuit elements in the substrate.

Thus, there remains a need for a capacitor which can be produced using high dielectric constant materials yet avoids the problems associated with a reduction in the effectiveness of the finished structure.

SUMMARY OF THE INVENTION

It is therefore an object of the present invention to provide a capacitor which incorporates a high dielectric constant material which minimizes or avoids contact between silicon and the high dielectric constant material, especially during high dielectric constant material deposition.

It is a further object to provide such a capacitor which minimizes patterning steps for the electrodes.

It is another object to provide a capacitor which incorporates a high dielectric constant material which allows a good connection between the capacitor and the semiconductor circuit elements in the substrate.

It is yet another object to provide such a capacitor which is suitable for large scale production.

In accordance with the above listed and other objects, a capacitor structure is provided, with a first conductor on top of a substrate, a first non-conductor on top of and substantially in register with the first conductor, the first conductor and first non-conductor having a first opening formed therein, a non-conductive sidewall spacer formed in the first opening, the non-conductive sidewall spacer having a second opening formed therein, and a second conductor formed in the second opening.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
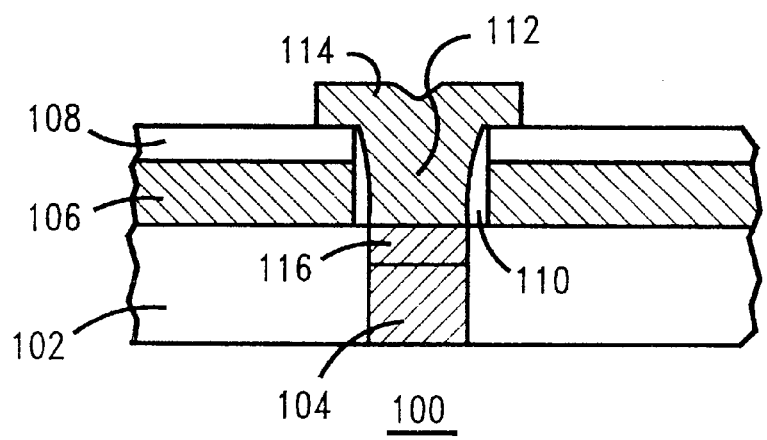
FIG. 1 shows an isolated sidewall capacitor.

Referring now to the drawings and more particularly to FIG. 1, one embodiment of the isolated sidewall capacitor is shown. A substrate 100 has a dielectric (non-conductive) layer 102 formed thereon, and a conductive plug 104 embedded in layer 102. Plug 104 provides contact to the desired circuit elements in substrate 100 (not shown). An optional electrically conductive diffusion barrier 116 may be located on top of plug 104. A first electrode 106 (conventionally referred to as a top or plate electrode, which forms an electrical connection between the capacitor dielectric and the common voltage or ground) is formed on dielectric layer 102, followed by another dielectric layer 108. An optional adhesion layer (not shown) may be used between electrode 106 and dielectric 108. A high dielectric constant sidewall spacer 110 is positioned as shown, and a second electrode 112 (conventionally referred to as a bottom electrode) is located within sidewall spacer 110, and may or may not have a top portion 114. Note that the structure formed is a predominantly annular or oval capacitor when viewed from above (not shown).

Figure 2A:
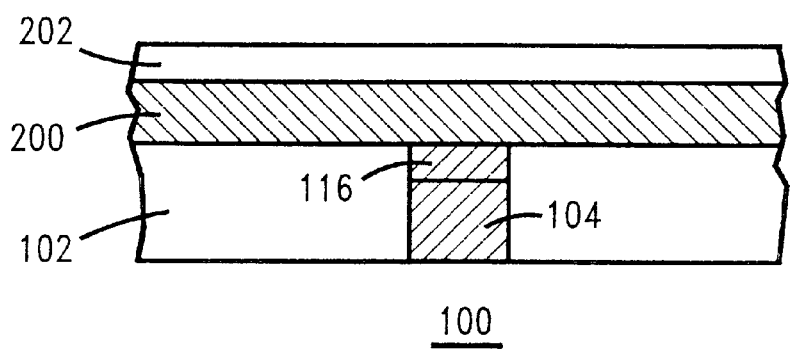
FIGS. 2(a) through 2(e) illustrate one set of steps that may be used to manufacture the capacitor of FIG. 1.

FIGS. 2(a) through 2(e) illustrate one set of steps that may be used to manufacture the capacitor of FIG. 1. In FIG. 2(a), dielectric layer 102 has been formed on substrate 100, and patterned by conventional means, for example by reactive ion etching (RIE). Dielectric layer 102 may be $SiO_2$, $SiN_x$, phosphosilicate glass (PSG), borophosphosilicate glass (BPSG), a spin-on-glass, flowable oxide, or similar materials. Note also that more than one dielectric layer can be used in place of a single layer 102, so that the topmost layer can be used as an etch stop during subsequent processing, for example. Conductive plug 104 has been formed by a conventional process such as chemical vapor deposition (CVD) followed by planarization by chemical mechanical polishing (CMP) for example. Plug 104 may be doped polysilicon, W, or any suitably conductive material. Note that the diameter of plug 104 is not critical, and may be significantly narrower or wider than as shown. After an etch-back process to recess plug 104 below the surface of dielectric 102, diffusion barrier 116 has been formed, again by a conventional process such as sputtering, and may be $Ta_{1-x}Si_xN_y$ (with 0<x<1 and y>0), TiN, or similar materials.

Conductive layer 200 and dielectric layer 202 are then formed by conventional means, for example sputter deposition for layer 200 and low temperature CVD, plasma CVD, or sputter deposition for layer 202. Diffusion barrier 116 can function as an etch stop during patterning of layers 200 and 202. Conductive layer 200 may be selected for example from the groups of materials known as noble metals (e.g. Au, Pt, Pd, Ir, Rh, etc.), alloys of noble metals with noble metals or non-noble metals, metals whose oxides are conducting (e.g. Ru, Mo, etc.), electrically conducting oxides (e.g. $RuO_2$, $IrO_2$, $Re_2O_3$, etc.), electrically conducting nitrides (e.g. TaN, TaSiN, TiN or WN, etc), or similar materials, and may be approximately 3500 Å thick. Dielectric layer 202 may be of $SiO_2$, $SiN_x$, $Al_2O_3$, $TiO_2$, flowable oxides, spin-on-glasses, PSG, BPSG, high-dielectric constant materials such as BST, or similar materials, and may be approximately 1000 Å thick.

Figure 2B:
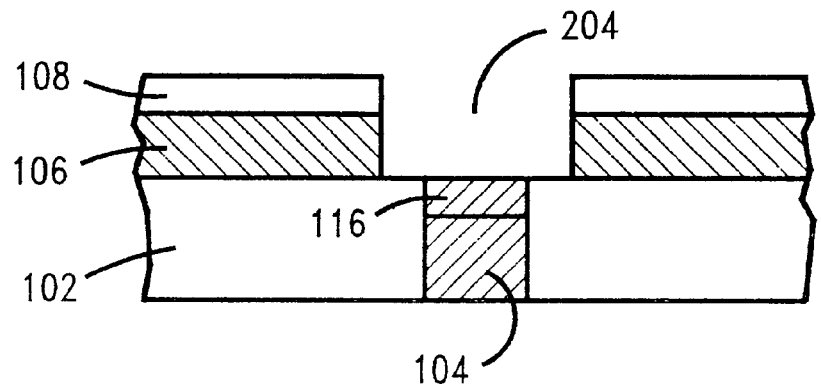

In FIG. 2(b), conductive layer 200 and dielectric layer 202 are patterned conventionally (by reactive ion etching, for example) to form an opening 204, top electrode 106, and dielectric 108. Opening 204 may be approximately 0.2 to 0.5 microns in diameter.

Figure 2C:
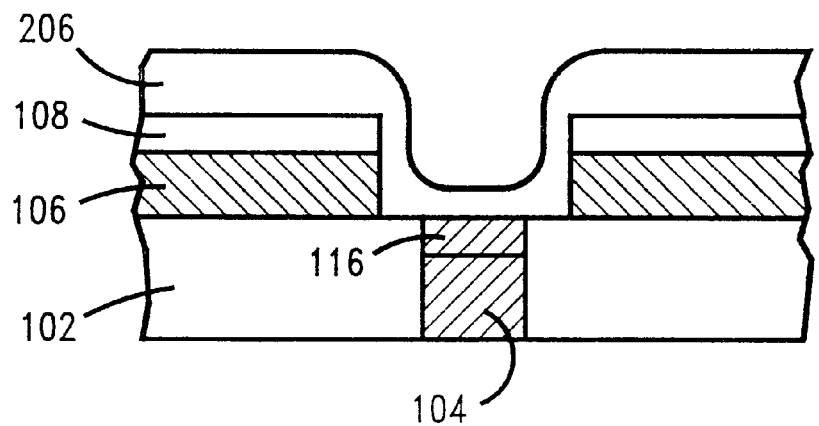
Figure 2D:
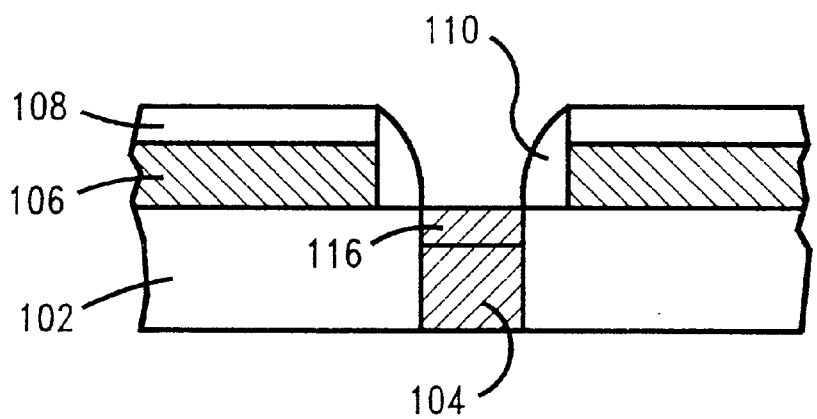

Opening 204 is then cleaned using conventional means, for example RIE. In FIG. 2(c), a conformal layer of high dielectric constant material 206 is formed, for example by chemical vapor deposition (CVD), and in FIG. 2(d), material 206 is patterned to form sidewall spacer 110 by conventional means, for example by reactive ion etching (RIE). High dielectric constant material 206 may be selected from the groups of materials known as ferroelectrics, paraelectrics, perovskites, layered perovskites, relaxors, pyrochlores, or any material with a dielectric constant roughly greater than or equal to 20. Examples of such materials are $Ta_2O_5$, $(Ta_2O_5)_x(TiO_2)_{1-}$ with 0<x<1, $PbMg_xNb_{1-x}O_{3+y}$ with 0<x<0.5, 0<y<1 (PMN), $(Ba,Sr)TiO_3$ (BST or BSTO), $SrBi_2Ta_2O_9$ (SBT), $BaTiO_3$, $SrTiO_3$, $PbZr_{1-x}Ti_xO_3$ (PZT), $PbZrO_3$, $Pb_{1-x}La_xTiO_3$ (PLT), and $Pb_{1-x}La_x(Zr_yTi_{1-y})_{1-x/4}O_3$ (PLZT).

Figure 2E:
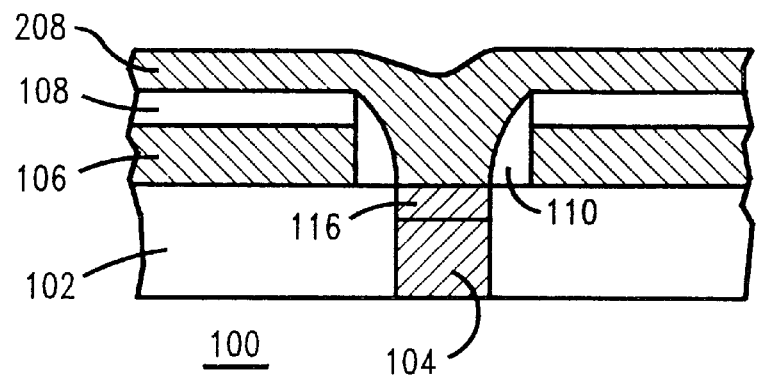

In FIG. 2(e), conductive layer 208 is formed, and then is patterned by conventional means (by RIE or ion beam sputtering, for example) to form bottom electrode 112 as shown in FIG. 1. Note that bottom electrode 112 is isolated from top electrode 106. Note also that a self-aligned chemical mechanical polishing (CMP) process may be used if desired to pattern layer 208 and eliminate top portion 114 at the same time. Conductive material 208 may be selected from the same group of materials as conductive layer 200, plus conductive materials whose oxides may be insulating (e.g. Ti, Al, TiN, W, etc.). In addition, conductive material 208 may be a combination material such as a TiN liner with an overcoat of W or doped polysilicon.

After bottom electrode 112 is formed, the capacitor structure may be annealed. During annealing, diffusion barrier 116 acts either as a barrier to oxygen diffusion or a barrier to plug material diffusion or both.

The resulting capacitor structure with a solely vertical high dielectric sidewall spacer 110 minimizes the required thickness of plate electrode 106, thus avoiding difficulty in patterning thicker layers of electrode materials such as Pt. This is because any non-vertical component of a dielectric sidewall spacer reduces the effective height of the plate electrode. Thus, in order to achieve the same capacitance when using a non-vertical component, both the sidewall spacer and the plate electrode must be taller, requiring more material.

Figure 3:
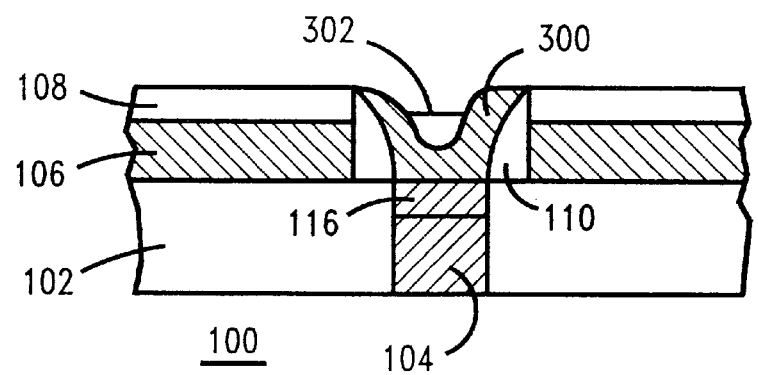
FIG. 3 shows an isolated sidewall capacitor with a filled bottom electrode.

FIG. 3 shows another embodiment of the isolated sidewall capacitor. FIG. 3 is similar to FIG. 1 except that bottom electrode 300 lacks a top portion (114 in FIG. 1) and thus has a top surface which is substantially coplanar with sidewall spacer 110, and also has a fill material 302 in its center.

Figure 4A:
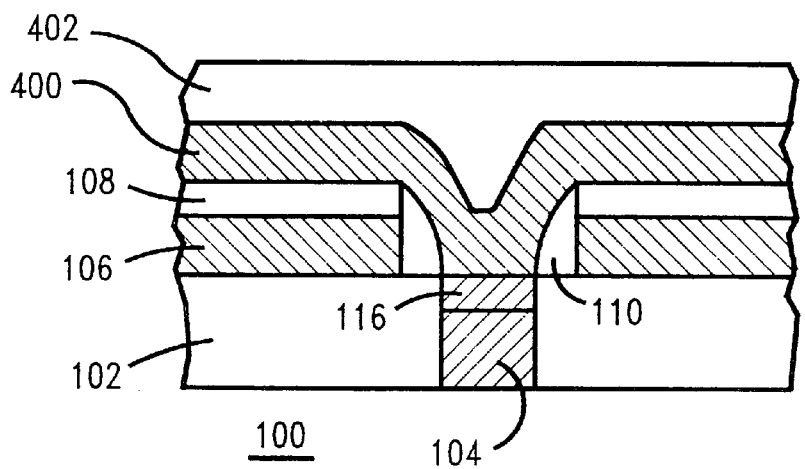
FIGS. 4(a) through 4(c) illustrate alternate steps to that shown in FIG. 2(e) that may be used to manufacture the capacitor of FIG. 3.
Figure 4:
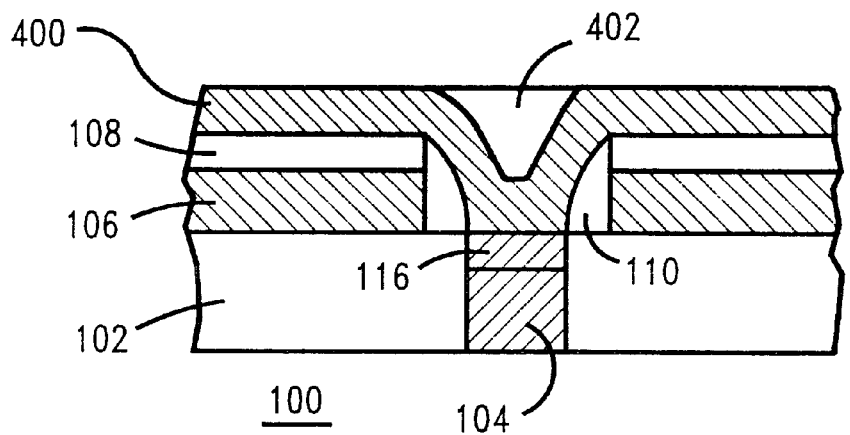
Figure 4:
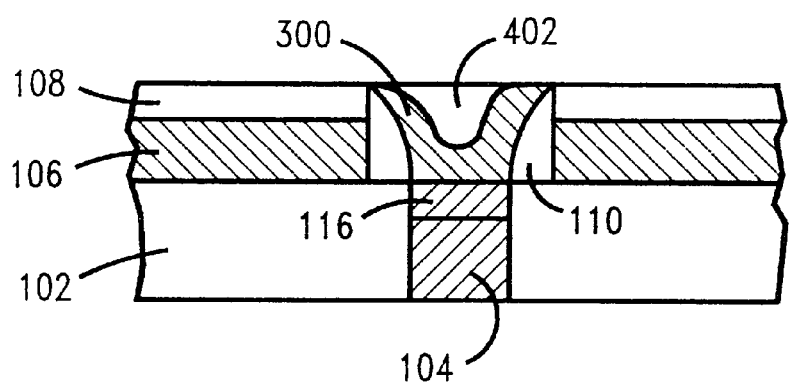

FIGS. 4(a) through 4(c) show alternate steps to that shown in FIG. 2(e) that may be used to manufacture the capacitor of FIG. 3. In FIG. 4(a), a thin layer, preferably conformal, of conductive material 400 is formed, followed by a fill layer 402. Conductive layer 400 is selected from the same class of materials as conductive material 208, and fill layer 402 can be one or more layers, for example TaSiN, TaN, TiN, TiN plus dielectrics such as $SiO_2$, $Al_2O_3$, $SiN_x$, spin-on-glass, the same dielectrics without TiN, etc. In FIG. 4(b), fill layer 402 is reduced in thickness if necessary (by planarization, etchback, or other conventional means) to be approximately coplanar with conductive layer 400. In FIG. 4c, conductive material 400 is patterned conventionally (by blanket etch, for example) to form bottom electrode 300 as shown in FIG. 3. The remaining fill layer 402 may be further etched back or removed altogether. Note that, depending on the process chosen for planarization and optional removal, the fill material should be "planarizable", etch resistant while the bottom electrode is being etched, and selectively etchable with respect to the bottom electrode material if the fill material is to be removed from the final structure.

FIG. 3 has an advantage over FIG. 1 in that bottom electrode 112 is defined by a self-aligned process, thus avoiding an additional lithographic alignment step. Also, the FIG. 3 structure is more planar, making formation and processing of additional layers on top of the capacitor easier.

Figure 5:
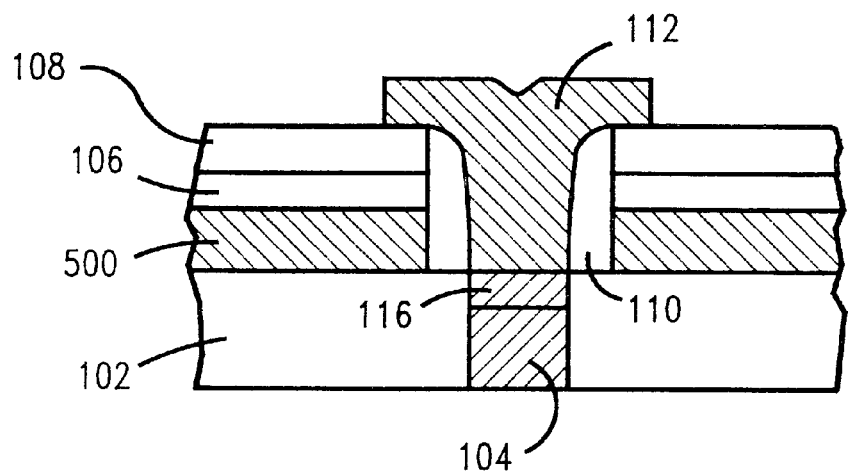
FIGS. 5 and 6 show the isolated sidewall capacitor with an additional non-conductive layer.

FIG. 5 shows another embodiment of the isolated sidewall capacitor. FIG. 5 is similar to FIG. 1, except that an additional layer 500 has been added between dielectric layer 102 and top electrode 106. Layer 500 may be either a conductive or non-conductive (dielectric) layer, and may function as an etch stop or buffer layer when etching top electrode 106. Layer 500 is etched to expose plug 104 prior to forming dielectric sidewall spacer 110.

Figure 6:
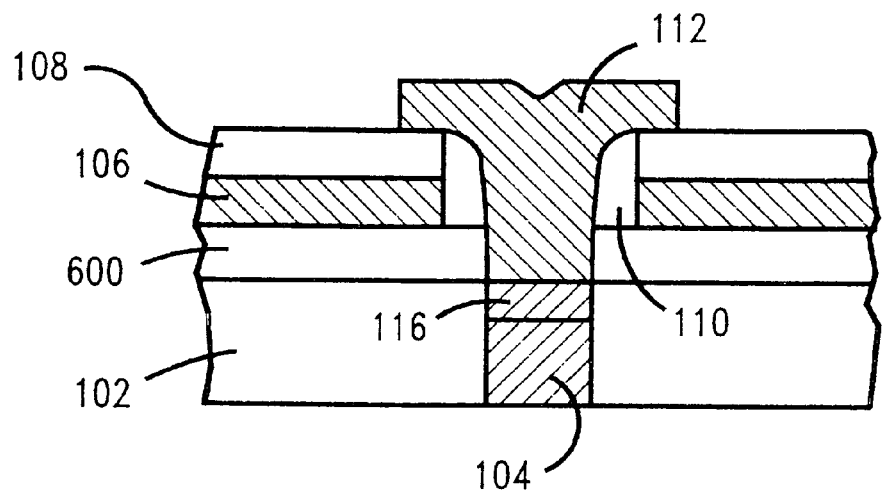

FIG. 6 shows a variation from the isolated sidewall capacitor of FIG. 5. A dielectric layer 600 is positioned between dielectric layer 102 and top electrode 106, but extends underneath dielectric sidewall spacer 110. Like layer 500, dielectric 600 may also serve as an etch stop when etching top electrode 106, but also acts as a barrier to protect conductive plug 104 during formation of high dielectric constant sidewall spacer 110. After sidewall spacer 110 is formed, dielectric 600 is patterned to expose conductive plug 104, using sidewall spacer 110 as a mask.

The structures of FIGS. 5 and 6 have the additional advantage over that in FIG. 1 in that layers 500 and 600, respectively, can serve as an adhesion promoter between electrode 106 and dielectric 102. Layer 600 can also protect plug 104 during deposition of high dielectric constant material 204.

Figure 7:
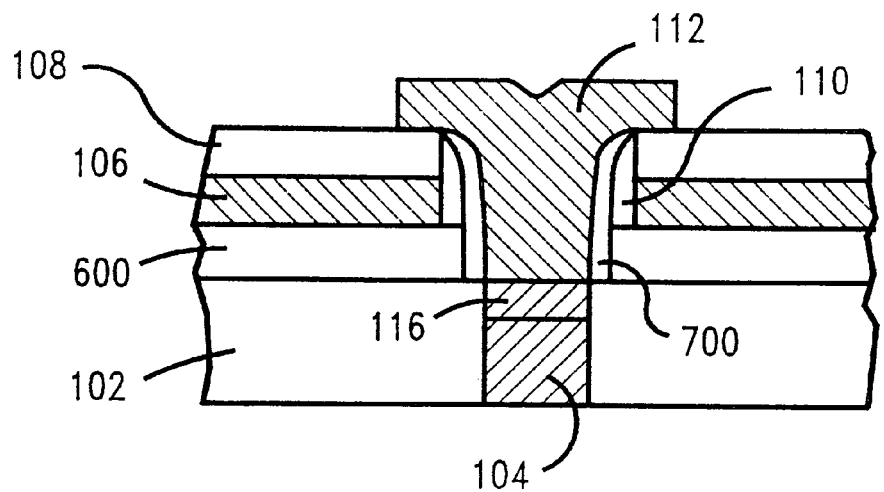
FIGS. 7, 8, and 9 show embodiments of the isolated sidewall capacitor with a compound bottom electrode.
Figure 8:
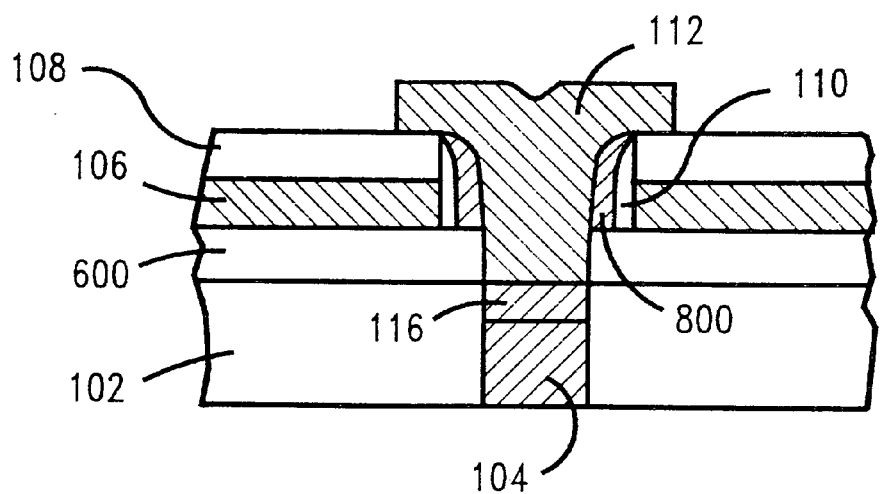
Figure 9:
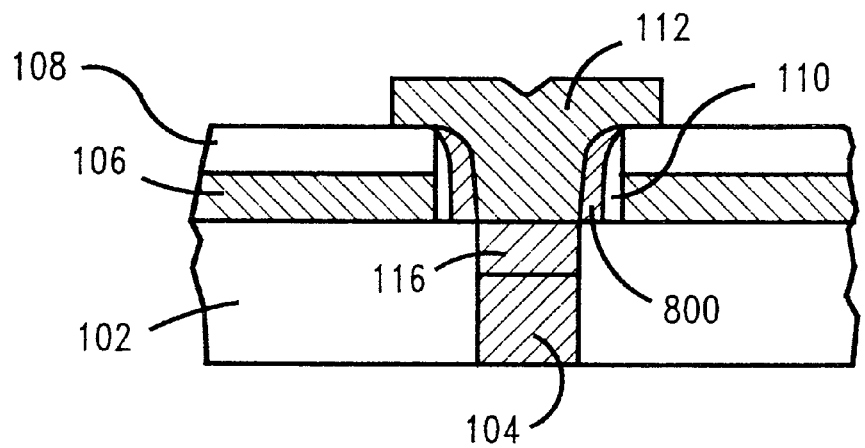

FIGS. 7, 8, and 9 show an isolated sidewall capacitor with a compound bottom electrode. FIG. 7 is similar to FIG. 6, with the addition of a conductive sidewall spacer 700 which extends from the top of dielectric layer 108 to the bottom of dielectric layer 600. Conductive sidewall spacer 700 is electrically connected to plug 104 via the conductive material in bottom electrode 112. Together, conductive sidewall spacer 700 and bottom electrode 112 form a compound bottom electrode.

One advantage of using a compound bottom electrode is that the portion of bottom electrode 112 in contact with plug 104 may be formed after an annealing of the critical interface between dielectric sidewall spacer 110 and conductive sidewall spacer 700. This eliminates the possibility of bottom electrode/plug reactions during annealing, and thus allows the use of a wider variety of materials for the portion of bottom electrode 112 contacting conductive sidewall spacer 700 to plug 104. For example, Pt could be used for the conductive sidewall spacer, allowing an oxygen anneal, and TiN/polysilicon might be used for the remainder of bottom electrode 112.

FIG. 8 shows a modification from FIG. 7 in that both dielectric sidewall spacer 110 and conductive sidewall spacer 800 extend only to the top of dielectric layer 600, and thus layer 600 is formed using sidewall spacers 110 and 800 as a mask. FIG. 9 shows a slight modification of FIG. 8 where dielectric layer 600 is omitted.

Figure 10:
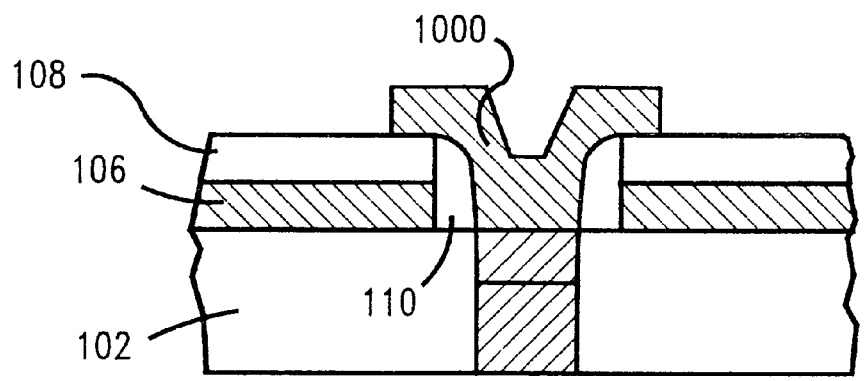
FIG. 10 shows an isolated sidewall capacitor with the bottom electrode also providing contact to other circuit elements in the substrate, all in accordance with the present invention.

FIG. 10 shows an isolated sidewall capacitor with a bottom electrode providing contact to other circuit elements in the substrate. FIG. 10 is similar to FIG. 1, with a bottom electrode 1000 extended down to fill the space previously occupied by conductive plug 104. Processing is similar to that used to produce the structure of FIG. 1, except that the opening in layer 102 is etched after the rest of the capacitor is formed, using high dielectric constant sidewall spacer 110 as a mask. Thus a lithographic alignment step (used to initially form plug 104) is avoided. In addition, because a "plug" is formed after high dielectric constant material 204 is deposited and patterned into sidewall spacer 110, there is no risk of a preexisting plug being destroyed during the deposition step. Note that the capacitor of FIG. 10 can be modified to have an additional dielectric layer as shown in FIGS. 5 or 6, and/or a compound bottom electrode as shown in FIGS. 7, 8, or 9.

In summary, a capacitor has been provided which incorporates a high dielectric constant material which minimizes or avoids contact between silicon and the high dielectric constant material, especially during high dielectric constant material deposition. In addition, patterning steps for the electrodes are minimized, and a good connection between the capacitor and the residual transfer device in the substrate (in the form of the conductive plug plus optional diffusion barrier). The capacitor described is thus suitable for large scale production.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for making a capacitor structure in a substrate comprising the steps of:

forming a conductive plug in said substrate;

forming a first conductor on said substrate;

forming a first non-conductor on top of and substantially in register with the first conductor;

defining a first opening in said first conductor and first non-conductor said first opening being substantially aligned with said conductive plug and exposing said substrate;

forming a continuous non-conductive sidewall spacer in the first opening;

forming a second opening in said continuous non-conductive sidewall spacer whereby said resulting sidewall spacer comprises first and second continuous non-conductive sidewalls and said second opening exposing said substrate; and forming a second conductor in the second opening, wherein said first and second continuous non-conductive sidewalls of said resulting sidewall spacer insulate said first conductor from said second conductor.

2. The method of claim 1 further comprising the step of forming a conductive sidewall spacer within the non-conductive sidewall spacer and electrically contacting the second conductor.

3. The method of claim 2 further comprising the step of forming a conductive diffusion barrier in said substrate over said conductive plug prior to forming said first conductor.

4. The method of claim 1, further comprising the step of forming a third opening in the second conductor.

5. The method of claim 1 further comprising the step of forming a second non-conductor below the first conductor.

6. The method of claim 4, further comprising the step of at least partially filling the third opening with a fill material.

7. The method of claim 5 wherein the second non-conductor is substantially in register with the first conductor.

8. The method of claim 5 wherein the second non-conductor extends underneath the non-conductive sidewall spacer to contact the second conductor.

* * * * *